United States Patent
Gedamu et al.

(10) Patent No.: US 7,818,645 B2
(45) Date of Patent: Oct. 19, 2010

(54) BUILT-IN SELF-TEST EMULATOR

(75) Inventors: Elias Gedamu, Montreal (CA); Denise Man, Fort Collins, CO (US); Eric Richard Stubblefield, Fort Collins, CO (US); Oguz Ertekin, San Mateo, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 889 days.

(21) Appl. No.: 11/185,291

(22) Filed: Jul. 20, 2005

(65) Prior Publication Data
US 2006/0026478 A1   Feb. 2, 2006

Related U.S. Application Data

(60) Provisional application No. 60/590,254, filed on Jul. 22, 2004.

(51) Int. Cl.
G01R 31/28 (2006.01)
G06F 11/00 (2006.01)
G06F 13/00 (2006.01)

(52) U.S. Cl. .......................... 714/733; 714/28; 714/30; 714/736; 711/114; 711/128

(58) Field of Classification Search .................. 714/733, 714/28, 30, 736; 711/114, 128
See application file for complete search history.

(56) References Cited

U.S. PATENT DOCUMENTS 6,351,789 B1 * 2/2002 Green ......................... 711/128
7,168,005 B2 * 1/2007 Adams et al. ................. 714/31

OTHER PUBLICATIONS

Dimitrakopoulos et al., "Virtual-Scan: A Novel Approach for Software-Based Self-Testing of Microprocessors", May 2003, IEEE, pp. V-237-V-240.*
Su et al., A computer aided engineering system for memory BIST, Jan. 30, 2001, IEEE pp. 492-495.*
Chen et al., "Software-Based Self-Testing Methodology for Processor Cores". 2001 IEEE. vol. 20. No. 3. Mar. 2001.pp. 369-380.*
Wieler et al., Using an FPGA based computer as a hardware emulator for built-in self-test structures, Jun. 21, 1994, IEEE, pp. 16-21.*

* cited by examiner

*Primary Examiner*—John J Tabone, Jr.

(57) ABSTRACT

Systems, methods, and a computer program are disclosed. One embodiment comprises a compiler for developing verification tests of an integrated circuit. The compiler comprises an interface and a built-in self-test (BIST) emulator. The interface includes an input and an output. The interface receives and forwards operator-level instructions to the BIST emulator, which is coupled to the output. The BIST emulator simulates the operation of a BIST module within the integrated circuit.

20 Claims, 8 Drawing Sheets

BUILT-IN SELF-TEST EMULATOR

CROSS-REFERENCE TO RELATED APPLICATION

This application claims priority to copending U.S. provisional application entitled, "Built-In Self-Test Emulator," having Ser. No. 60/590,254, filed Jul. 22, 2004, which is entirely incorporated herein by reference.

BACKGROUND

Advances in integrated circuit design are accompanied by increased challenges for test and verification. For example, increased logic density leads to decreased internal visibility and control, reduced fault coverage and reduced ability to toggle states, more test development and verification problems, increased complexity of design simulation, etc.

Design for test techniques, such as a built-in self test (BIST) and an online test (e.g., a boundary scan) are known. Boundary scan and built-in self test, provide test access to a running fabricated circuit. An example of such a technique is described in the IEEE 1149.1 JTAG standard available from the Institute of Electrical and Electronic Engineers. These methods provide large-scale integrated circuit designers with mechanisms for verifying intended operation.

Generally, a BIST runs the integrated circuit in a test mode that differs from normal circuit operation while checking for faults. An online test checks for faults during normal operation of the integrated circuit. In order to take advantage of the visibility and control provided by BIST interfaces to the functional portions of the integrated circuit under test, online test designers generally require a significant amount of time to learn both the operation of the circuit being tested and the BIST hardware before they can generate productive test cases.

In addition, to the lengthy learning curve, large integrated circuit designs require a significant amount of time to develop a sufficient test that adequately exercises a device under test. Consequently, additional improvements and efficiencies are desired.

SUMMARY

A compiler, a method for verifying operation of a processor, and a computer program are disclosed. One embodiment is a compiler for developing verification tests of an integrated circuit. The compiler includes an interface and a built-in self-test (BIST) emulator. The interface includes an input and an output. The interface receives and forwards operator-level instructions to the BIST emulator, which is coupled to the output. The BIST emulator simulates operation of a BIST module within the integrated circuit.

Another embodiment is a method for testing a processor. The method includes providing a compiler configured to simulate the operation of a BIST module within the processor, applying an operator-level instruction to the compiler, observing at least one status indicator responsive to execution of at least one hardware-level instruction, and determining whether the at least one status indicator is indicative of an expected condition.

Another embodiment is a computer program stored on a computer-readable medium. The computer program comprises logic configured to generate at least one hardware-level instruction responsive to an operator-level instruction, logic configured to apply the at least one hardware-level instruction at a BIST emulator, logic configured to monitor the status of at least one data storage location, and logic configured to determine whether the status of the at least one data storage location is indicative of an expected condition.

DETAILED DESCRIPTION

In one exemplary embodiment, a processor test system is configured to interface with a processor or a model of a processor. The processor contains dual cores with each core having dedicated internal instruction and data caches. The processor further contains a controller that manages transfers to and or from an external cache and the cores. An input/output interface forwards instructions to the cores and is coupled to a built-in self-test (BIST) module. The BIST module enables verification testing of the internal instruction and data caches, the external cache, the cores, and the controller. It should be appreciated that results of a processor BIST may be useful to processor designers and/or manufacturers.

The processor test system includes a compiler useful in generating tests that can be applied either to a processor model or an actual processor and data storage devices in communication with and under the control of the processor. The compiler contains a BIST emulator (i.e., code that emulates the physical interface, operation, etc., of the BIST module within the processor). The BIST emulator provides functions that initialize and manipulate data storage elements both within and in communication with the processor as well as initialize and manipulate indicators associated with the data storage elements.

Figure 1:
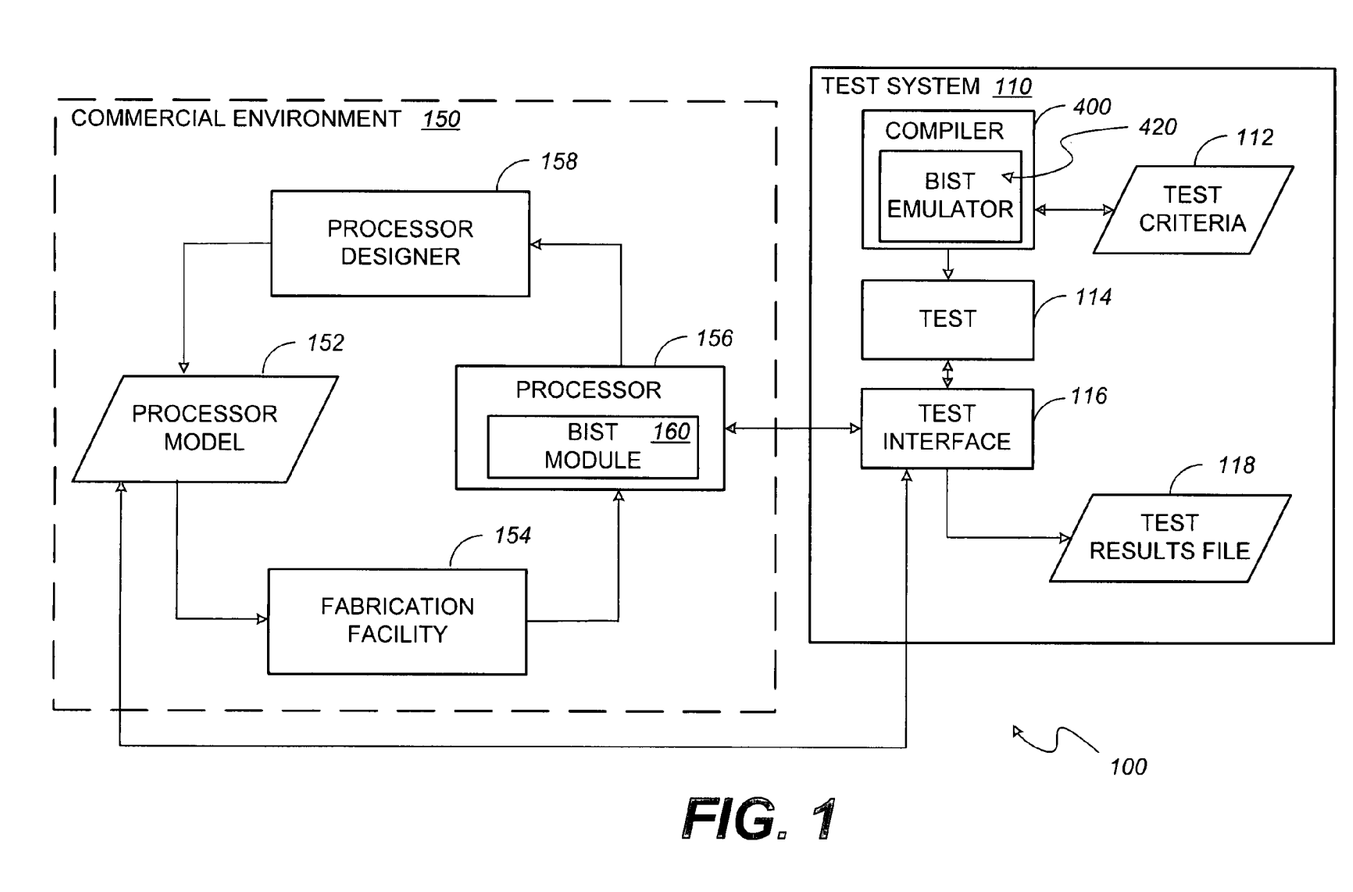
FIG. 1 is a block diagram of a testing environment for testing integrated circuits, which includes a compiler for generating verification tests.

FIG. 1 illustrates an embodiment of a processor design/manufacture/test environment 100 in which various embodiments of a compiler 400 may be implemented. As illustrated in the embodiment of FIG. 1, environment 100 comprises commercial environment 150 and test system 110. In commercial environment 150, a processor designer 158 designs a processor to be manufactured. As further illustrated in FIG. 1, the architecture, functionality, layout (or floorplan), etc. may be embodied in a processor model 152 that may be provided to a fabrication facility 154 for manufacture. Fabrication facility 154 manufactures processor 156 according to processor model 152. It should be appreciated that any type of integrated circuit may be designed and manufactured in such a commercial environment 150. The integrated circuit, for example, processor 156, contains BIST module 160. As described above, BIST module 160 enables non-operational mode testing of functional portions of the integrated circuit.

As illustrated in FIG. 1, compiler 400 in accordance with test criteria 112 produces test 114. Compiler 400 includes BIST emulator 420, which as described above includes a plurality of functions that can be used by a test designer to efficiently initialize and manipulate data storage elements and initialize and manipulate indicators associated with respective data storage elements. Test 114, which includes one or more hardware-level instructions responsive to operator-level instructions presented to the compiler 400, is communicated via test interface 116 to the processor 156 or to the processor model 152.

Test results file 118 may comprise a data file or other record that defines whether one or more data values and/or indicators associated with data storage elements within processor 156 or processor model 152 were as expected after execution of one or more instructions in the processor 156. One of ordinary skill in the art will appreciate that any of a variety of types of tests may be performed on processor 156 or processor model 152 and, therefore, both test 114 and test results file 118 may be configured accordingly. Various embodiments of test criteria 112 may be compiled by compiler 400 and thus configured to test the cache components (e.g., instruction cache, data cache, etc.), the cores, and other functional blocks of processor 156 or processor model 152.

Test interface 116 is configured to provide the physical, functional or other interface means between test system 110 and processor 156 or processor model 152. As known in the art, during operation of test system 110, the results of the tests performed on each processor 156 and/or corresponding aspects of processor model 152 may be logged to test results file 118.

Figure 2:
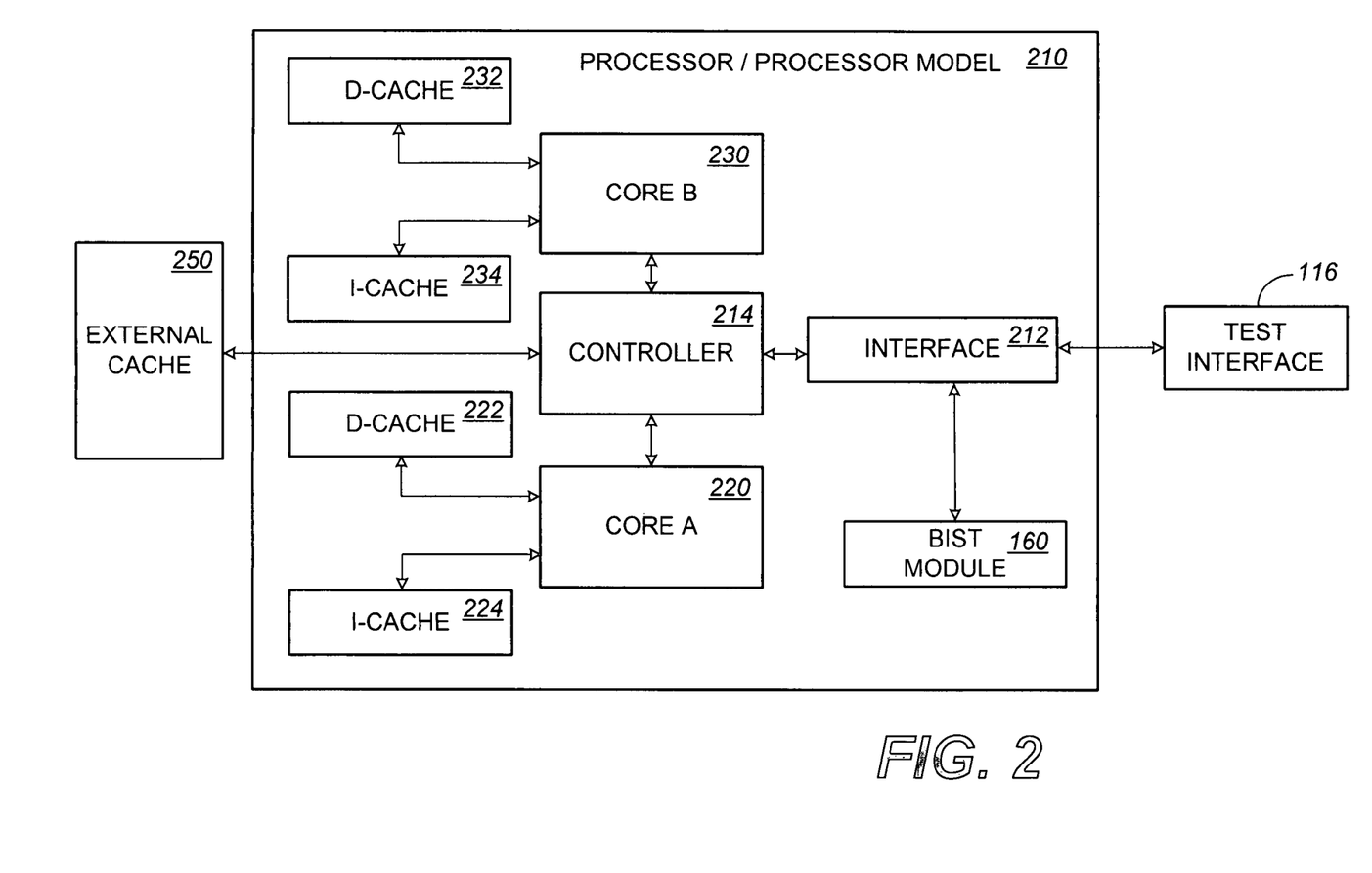
FIG. 2 is a more detailed block diagram of a portion of the testing environment of FIG. 1 illustrating example components of integrated circuits under test.

FIG. 2 illustrates an example embodiment of a processor/processor model 210. As described above, processor/processor model 210 communicates with test system 110 (FIG. 1) via test interface 116. Processor/processor model 210 includes interface 212, which is coupled to test interface 116. Interface 212 is also coupled to controller 214. Controller 214 is coupled to core A 220, core B 230, and external cache 250. Controller 214 manages processor load between core A 220 and core B 230. In addition, controller 214 manages data transfers to and from external cache 250 and interface 212. Each of the processor cores (i.e., core A 220 and core B 230) are coupled to an internal data cache and an internal instruction cache. As illustrated in FIG. 2, core A 220 is coupled to data cache 222 and instruction cache 224; core B 230 is coupled to data cache 232 and instruction cache 234.

Processor/processor model 210 also includes BIST module 160, which is coupled to controller 214 via interface 212. BIST module 160 enables non-operational mode testing of controller 214, core A 220, core B 230, as well as data caches 222, 232, instruction caches 224, 234, and external cache 250. BIST module 160 is configured to controllably initialize and manipulate data storage elements within each of the functional blocks within processor/processor model 210 as well as data storage elements in communication with processor/processor model 210 (i.e., external cache 250).

Figure 3:
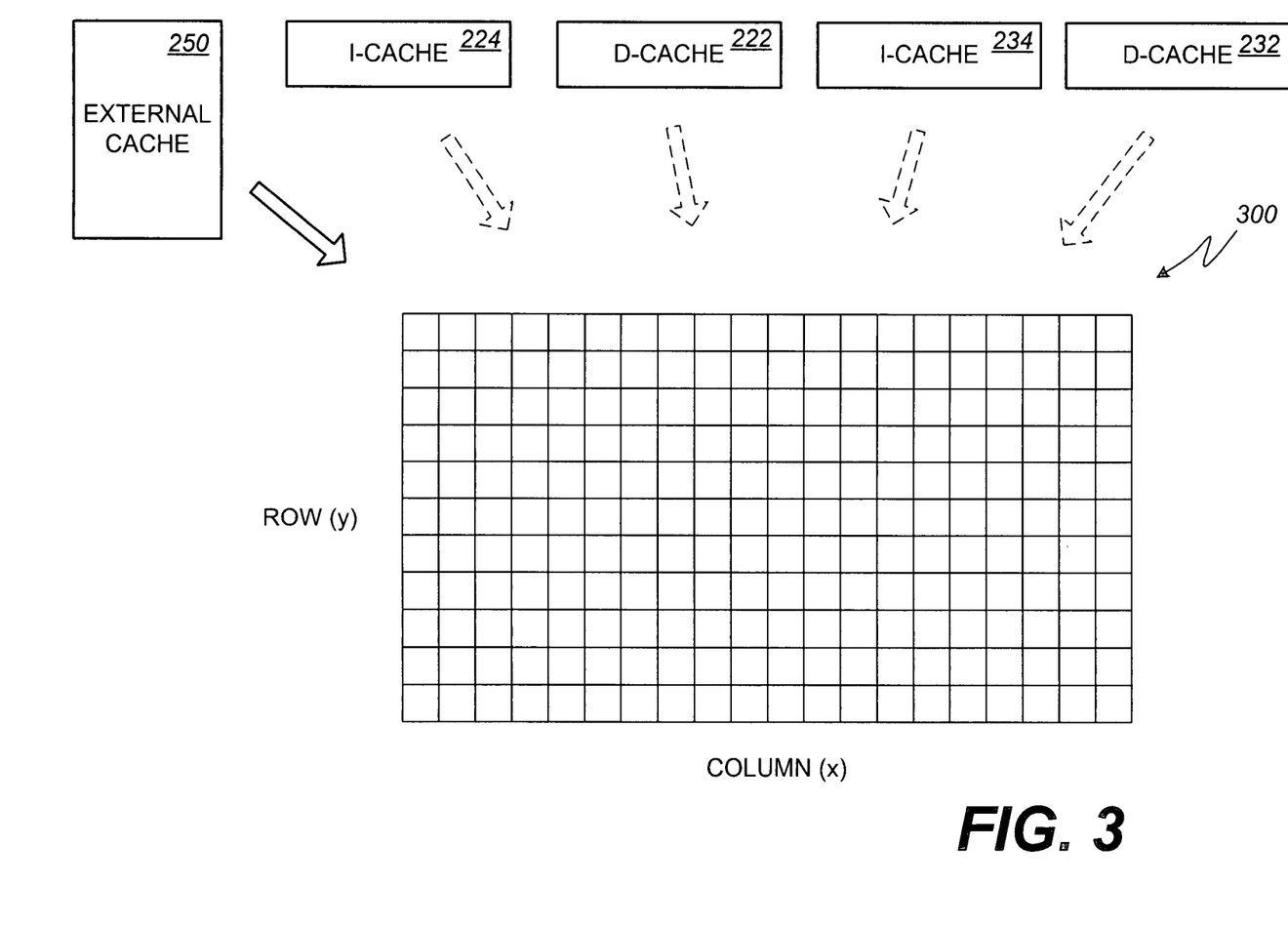
FIG. 3 is a simplified diagram illustrating an exemplary representation of one of the caches illustrated in FIG. 2.

Referring to FIG. 3, external cache 250, internal instruction caches 224, 234, as well as internal data caches 222, 232 may comprise a cache array 300 comprising various rows and columns. It should be appreciated that cache array 300 may be configured in a variety of ways and need not be configured in a symmetrical array. Rather, cache array 300 defines a grid that may be identified by X-Y coordinates corresponding to a bit at a particular location in cache array 300. As known in the art, a cache test may be performed to test various aspects of the cache array 300. In this regard, it should be appreciated that test results file 118 contains data corresponding to the particular tests performed.

As briefly described above, test system 110 is configured to interface with test results file 118. In one embodiment, test system 110 identifies when processor 156 or processor model 152 has passed a test (i.e., each instruction in test 114 results in one or more expected conditions as identified via an analysis of one or more indicators associated with the data storage elements of the various functional blocks). In other embodiments, test system 110 identifies particular storage elements and/or particular bits of storage elements associated with an indicator that identifies an unexpected condition as a result of the execution of a hardware-level instruction. In some embodiments, test system 110 interprets the data and identifies functional items that did not operate as expected.

Figure 4:
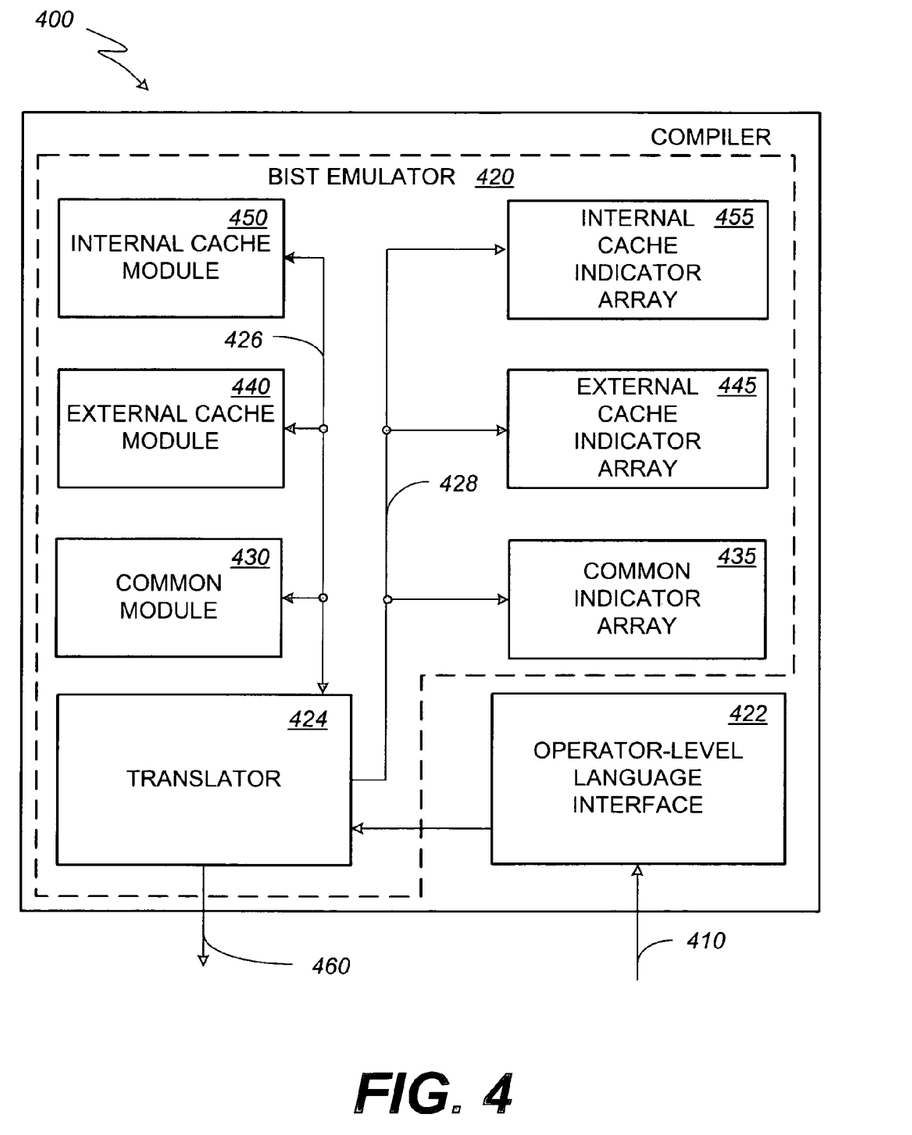
FIG. 4 is a functional block diagram of an embodiment of the compiler of FIG. 1.

The functional block diagram in FIG. 4 illustrates the architecture of an embodiment of compiler 400, which includes BIST emulator 420. Operator-level instructions enter compiler 400 via input 410. The operator-level instructions are received and forwarded by operator-level language interface 422 to translator 424. Translator 424 converts a received operator-level instruction to one or more hardware-level instructions. Translator 424 communicates with common module 430, external cache module 440, and internal cache module 450 via connection 426. In one embodiment, operator-level instructions are written in C++ and translator 424 responsively generates assembler instructions suited for operation on the processor/processor model 210 under test. Test status and other results are forwarded to test system 110 via output 460.

Common module 430 contains code suited for testing interface 212, controller 214, core A 220, and core B 230 of the processor/processor model 210 under test (FIG. 2). External cache module 440 contains code suited for testing external cache 250 (FIG. 2). Internal cache module 450 contains code suited for testing internal caches, such as data caches 222, 232 and instruction caches 224, 234 (FIG. 2). Common module 430 contains code suited for exercising various storage elements, arithmetic logic units, and instruction/data management functions within processor/processor model 210. External cache module 440 and internal cache module 450 contain march tests suited for exercising and verifying correct operation of storage elements within the caches (i.e., data caches 222, 232, instruction caches 224, 234, and external cache 250).

BIST emulator 420 also includes a plurality of indicator arrays in communication with translator 424 via connection 428. The indicator arrays include a common indicator array 435 for recording the status of data storage elements within functional processor blocks exercised and/or verified via code provided by common module 430. The indicator array includes one or more flags for recording binary conditions. In some embodiments, the indicator array includes a plurality of indices for recording data values associated with respective data storage elements. The indicator arrays further include an external cache indicator array 445 for recording the status of data storage elements within external cache 250 (FIG. 2) and an internal cache array 455 for recording the status of data storage elements within internal caches (i.e., data caches 222, 232, and instruction caches 224, 234). In some embodiments, the external cache indicator array 445 and the internal cache indicator array 455 include a plurality of indices for recording data values associated with respective data storage elements.

Figure 5:
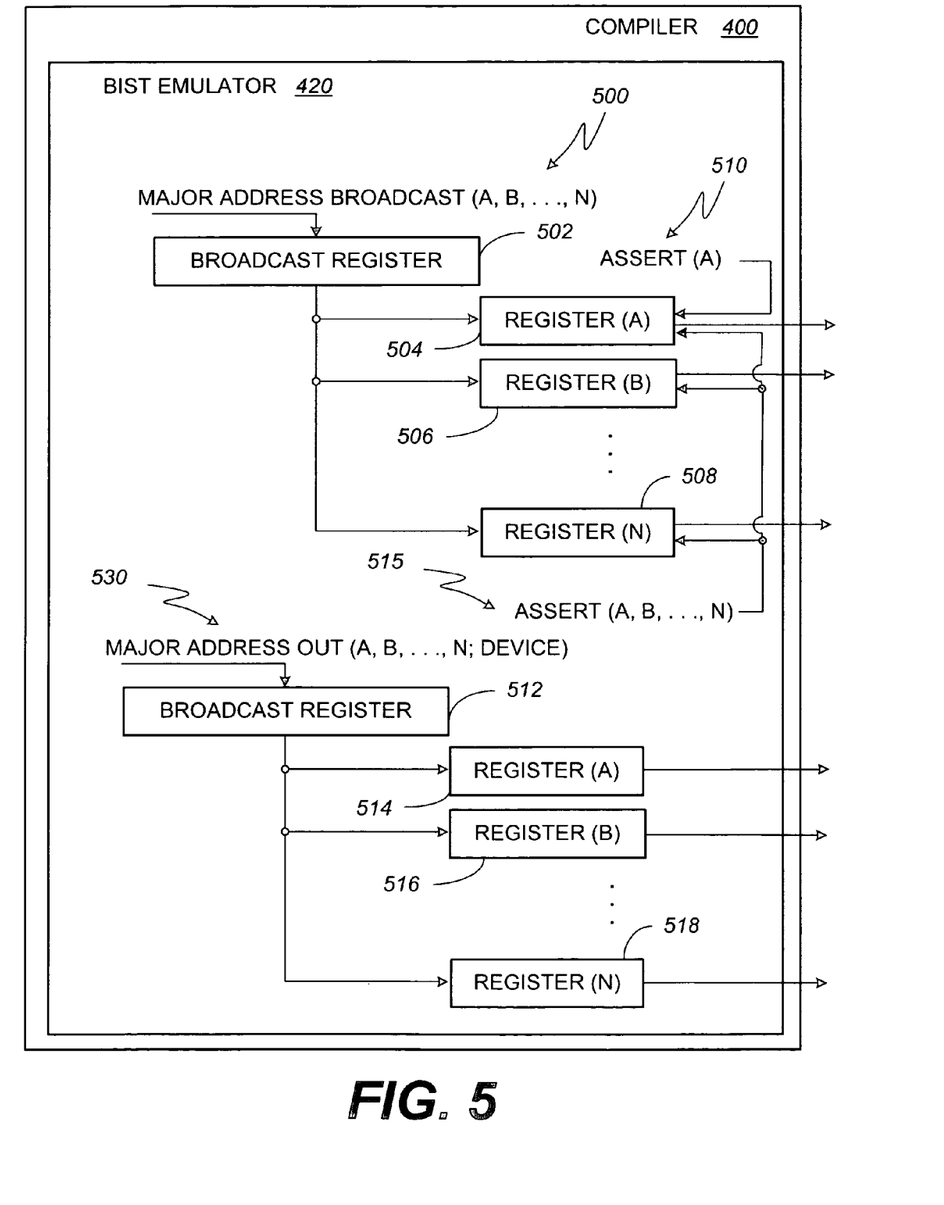
FIG. 5 is a diagram illustrating various functions of the compiler of FIG. 4.

FIG. 5 is a diagram illustrating several functions associated with compiler 400. A major address broadcast 500, a single assert 510, a multiple assert 515, and a major address output 530 function of compiler 400 are presented. The major address broadcast function 500 forwards the contents of broadcast register 502 to a plurality of identified registers. In the example illustrated in FIG. 5, the major address broadcast instruction includes variables indicating that the contents of broadcast register 502 are to be forwarded to register (A) 504, register (B) 506, through to register (N) 508.

Single assert 510 confirms the contents of an identified data storage element. In the example illustrated in FIG. 5, single assert 510 confirms the contents of register (A) 504. Single assert 510 can be used to confirm the contents of an identified data storage location after a reset operation, a data write operation, etc.

Multiple assert 515 confirms the contents of a plurality of identified data storage elements. In the example illustrated in FIG. 5, multiple assert 515 confirms the contents of register (A) 504, register (B) 506, through to register (N) 508.

The major address output function 530 forwards the contents of identified data storage elements (e.g., registers) to an identified output device. Each of the plurality of identified data storage elements is directed by broadcast register 512 to forward its respective data contents to the identified output device. Output devices may include a display, a printer, etc. In the example illustrated in FIG. 5, the major address output function 530 directs identified register (A) 514, register (B) 516, through to register (N) 518 to forward their respective data contents to the identified device.

Figure 6:
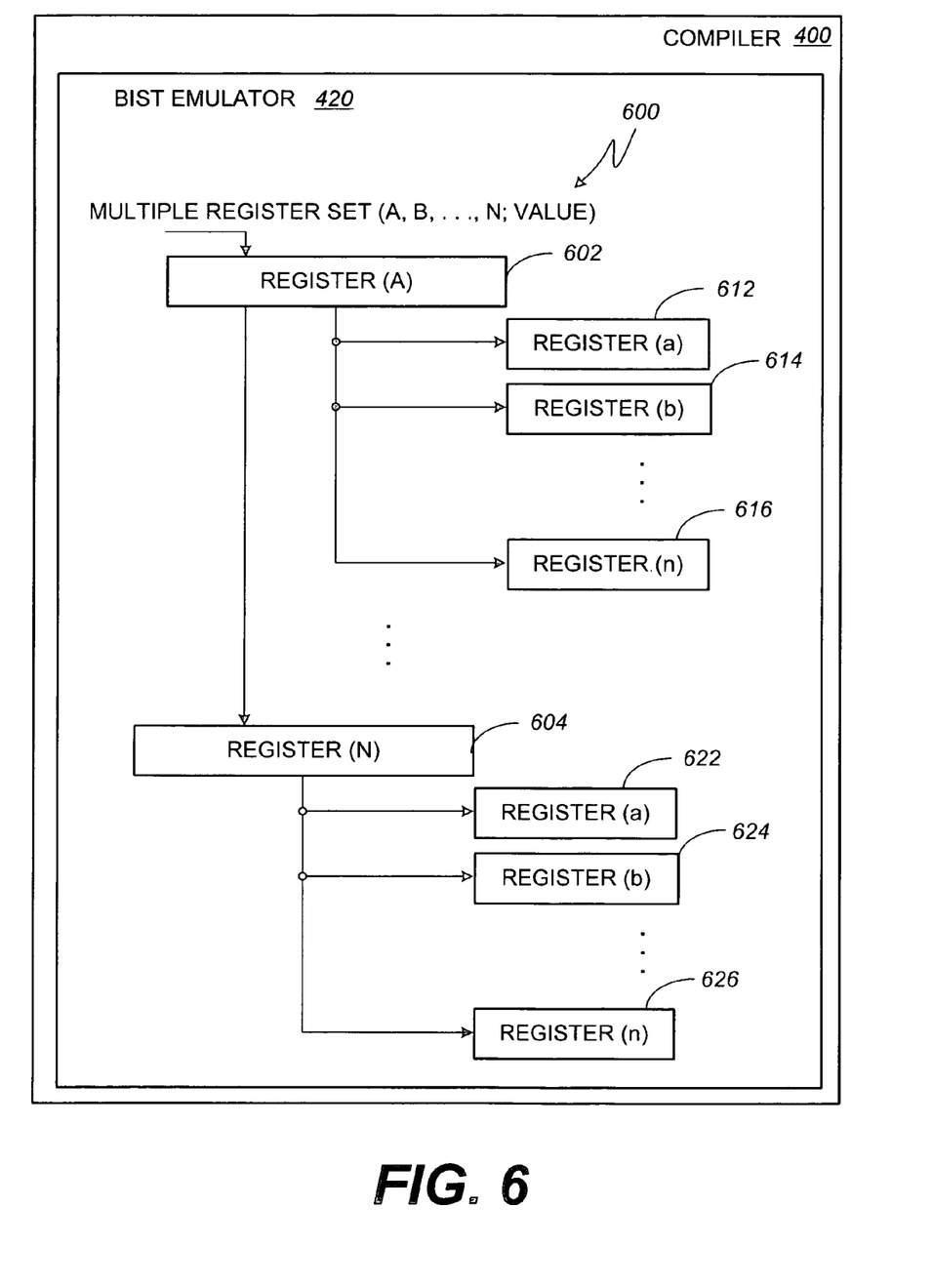
FIG. 6 is a diagram illustrating another function of the compiler of FIG. 4.

FIG. 6 is a diagram illustrating another function of compiler 400 of FIG. 4. Specifically, FIG. 6 illustrates a multiple register set function 600. The multiple register set function 600 directs each of one or more identified registers to initialize or otherwise set the contents of a plurality of similarly configured registers to the same data value. In the example illustrated in FIG. 6, multiple register set function 600 instructs register (A) 602 through to register (N) 604 to initialize similarly configured registers (a) 612, register (b) 614, through to register (n) 616 to the designated data value. Similarly, register (N) 604 and each intervening register between register (A) 602 and register (N) 604 also initialize similarly configured registers (a) 622, register (b) 624, through to register (n) 626 to the designated data value.

One of ordinary skill in the art will appreciate that compiler 400 and perhaps other portions of test system 110 may be implemented in software, hardware, firmware, or a combination thereof. Accordingly, in one embodiment, compiler 400 is implemented in software or firmware that is stored in a memory and that is executed by a suitable instruction execution system. In software embodiments, compiler 400 may be written in a high-level computer language. In one exemplary embodiment, compiler 400 comprises a C++ program.

In hardware embodiments, test system 110 may be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Furthermore, test criteria 112, compiler 400, test 114, test interface 116 and test results file 118 (FIG. 1) may be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain or store the program for use by or in connection with the instruction execution system, apparatus, or device. The computer-readable medium can be, for example but not limited to, an electronic, magnetic, optical, electromagnetic, infrared, or semiconductor system, apparatus, or device. More specific examples (a non-exhaustive list) of the computer-readable medium would include the following: a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical).

Figure 7:
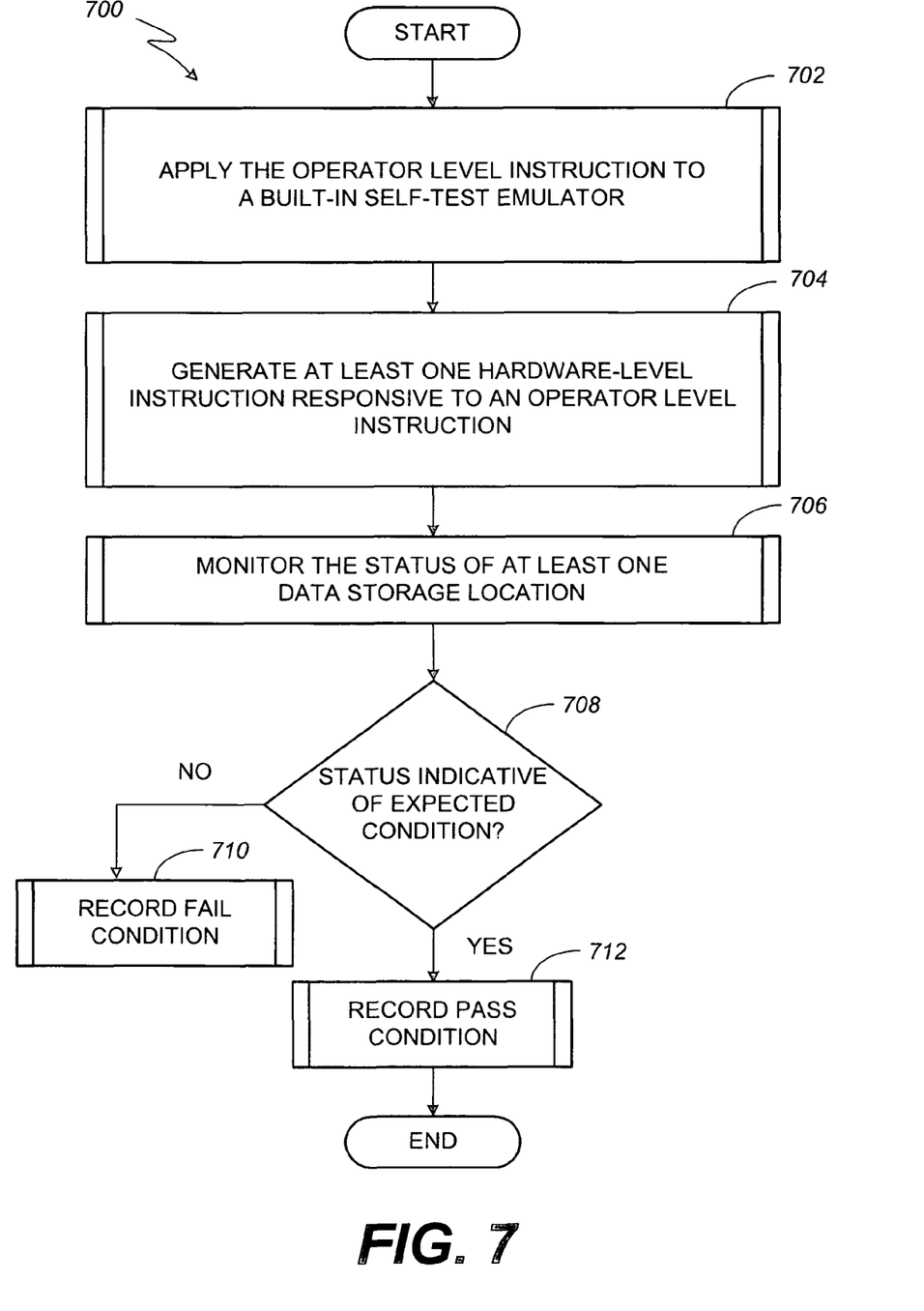
FIG. 7 is a flowchart illustrating the architecture, operation, and/or functionality of an embodiment of the BIST emulator of FIG. 4.
Figure 8:
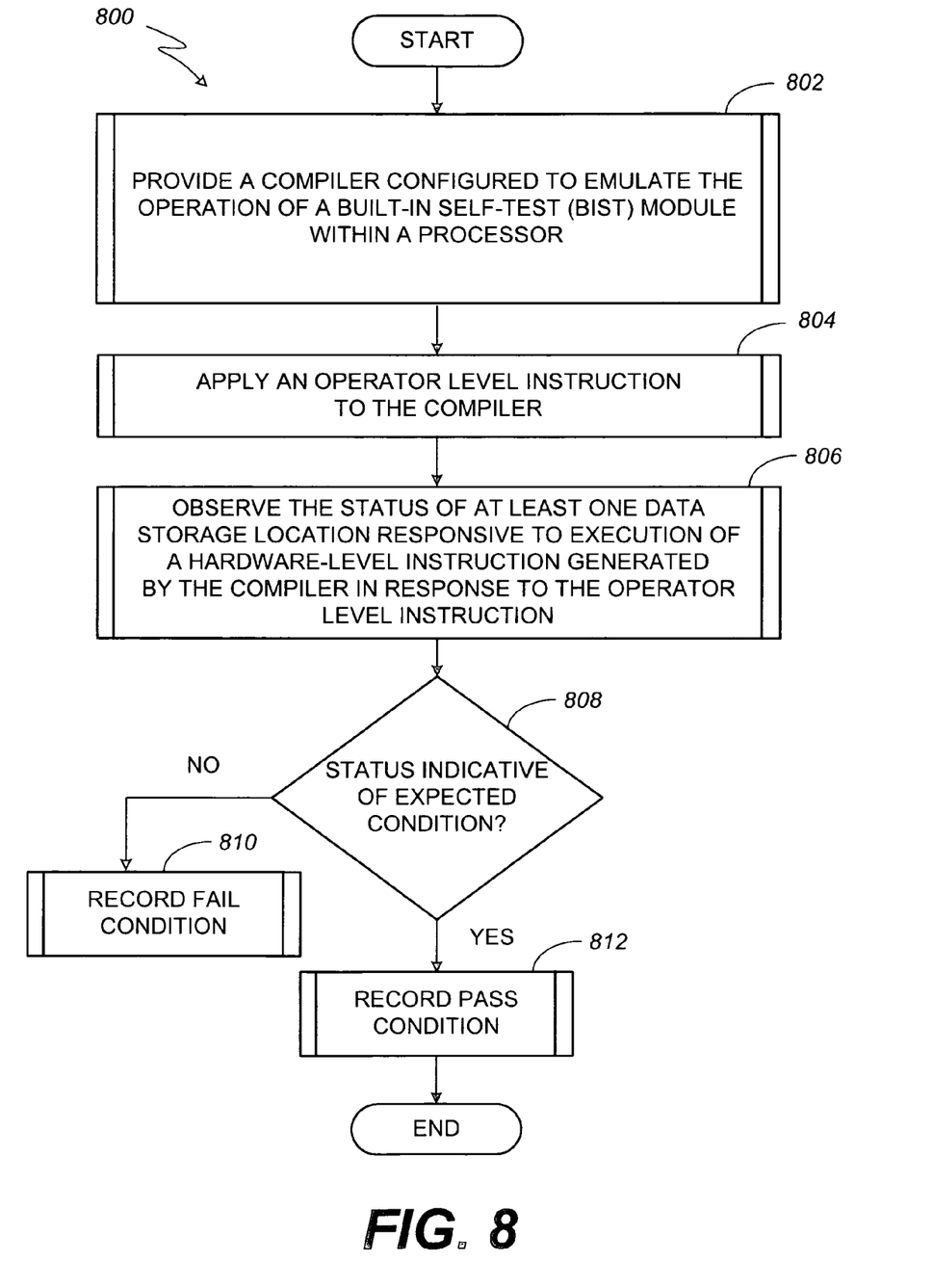
FIG. 8 is a flowchart illustrating one exemplary method for developing verification and performance tests of a processor.

It should be appreciated that the process descriptions or blocks related to FIGS. 7 and 8 represent modules, segments, or portions of code, which include one or more executable instructions for implementing specific logical functions or steps in the process. It should be further appreciated that any logical functions may be executed out of order from that shown or discussed, including substantially concurrently or in reverse order, depending on the functionality involved, as would be understood by those reasonably skilled in the art.

FIG. 7 is a flowchart illustrating the architecture, operation, and/or functionality of an embodiment of the BIST emulator 420 of FIG. 4. Flow diagram 700 begins with block 702 where an operator level instruction is applied to a built-in self-test emulator. At least one hardware-level instruction responsive to an operator level instruction is generated as shown in block 704. Following execution of the at least one hardware-level instruction, the status of at least one data storage location is monitored as indicated in block 706. Thereafter, as indicated in decision block 708 a determination is made if the status is indicative of an expected condition. When the status is indicative of an expected condition, as indicated by the flow control arrow labeled "YES," exiting decision block 708, a pass condition is recorded as shown in block 712. Otherwise, when the status is indicative of an unexpected condition, as indicated by the flow control arrow labeled "NO," exiting decision block 708, a fail condition is recorded as shown in block 710. The general flow illustrated in flow diagram 700 may be repeated as desired to verify operation of processor/processor model 210 (FIG. 2).

FIG. 8 is a flowchart illustrating one exemplary method for developing verification and performance tests of a processor/processor model 210 (FIG. 2). Method 800 begins with block 802 where a compiler configured to emulate the operation of a BIST module within a processor/processor model 210 is provided. In block 804, an operator level instruction is applied to the compiler provided in block 802. In block 806, the status of at least one data storage location responsive to execution of a hardware-level instruction generated by the compiler in response to the operator level instruction is observed. Thereafter, as indicated in decision block 808 a determination is made if the status is indicative of an expected condition. When the status is indicative of an expected condition, as indicated by the flow control arrow labeled "YES," exiting decision block 808, a pass condition is recorded as shown in block 812. Otherwise, when the status is indicative of an unexpected condition, as indicated by the flow control arrow labeled "NO," exiting decision block 808, a fail condition is recorded as shown in block 810. The general flow illustrated in method 800 may be repeated as desired to verify operation of processor/processor model 210 (FIG. 2).

What is claimed is:

1. A computer-readable storage medium encoded with instructions, the instructions comprising a compiler for developing a test for verifying operational performance of an integrated circuit comprising a built-in self-test (BIST) module, the compiler comprising:
an interface having an input and an output, the interface configured to receive and forward hardware level and operator level instructions; and
a built-in self-test (BIST) emulator coupled to the output of the interface, the BIST emulator configured to emulate the BIST module of the integrated circuit and to generate at least one hardware-level instruction to the integrated circuit, the hardware-level instruction responsive to an operator level instruction received at the interface.

2. The computer-readable storage medium of claim 1, wherein the BIST emulator is responsive to a BIST interface.

3. The computer-readable storage medium of claim 1, wherein the BIST emulator comprises a plurality of modules that reflect respective functional blocks of an integrated circuit design.

4. The computer-readable storage medium of claim 3, wherein the BIST emulator comprises a common module.

5. The computer-readable storage medium of claim 3, wherein the BIST emulator comprises an internal cache module.

6. The computer-readable storage medium claim 3, wherein the BIST emulator comprises an external cache module.

7. The computer-readable storage medium of claim 3, wherein the BIST emulator comprises code that configures a test interface.

8. The computer-readable storage medium of claim 3, wherein the BIST emulator comprises code that directs the BIST to modify a state of a plurality of data storage locations responsive to a hardware-level instruction.

9. The computer-readable storage medium of claim 3, wherein the BIST emulator comprises code that directs the BIST to modify an indicator of a status of a plurality of data storage locations responsive to a hardware-level instruction.

10. The computer-readable storage medium of claim 1, wherein the BIST emulator receives a high-level language instruction and the at least one hardware-level instruction comprises an assembler instruction.

11. A method for developing verification and performance tests of an integrated circuit comprising a processor with a built-in self-test (BIST) module, the method comprising:
providing a compiler configured to simulate the operation of the BIST module within the processor;
applying an operator level instruction to the compiler;
observing at least one status indicator responsive to execution of at least one hardware-level instruction to the integrated circuit, wherein the hardware-level instruction is responsive to the operator level instruction;
determining whether the at least one status indicator is indicative of an expected condition of the integrated circuit; and
transmitting a result of the determining.

12. The method of claim 11, wherein providing a compiler comprises generating code to simulate the operation of elements of the processor.

13. The method of claim 11, wherein applying an operator level instruction comprises modifying an indicator of a status of at least one data storage element associated with the processor.

14. The method of claim 11, wherein observing at least one status indicator comprises monitoring a row location in a cache.

15. The method of claim 11, wherein observing at least one status indicator comprises monitoring a column location in a cache.

16. The method of claim 11, further comprising:
applying at least one hardware-level instruction to configure at least one status identifier prior to applying the operator-level instruction.

17. A computer-readable storage medium comprising a program, the program comprising:
code configured to generate at least one hardware-level instruction responsive to an operator level instruction in a built-in self test (BIST) emulator, the BIST emulator configured to emulate a BIST module of an integrated circuit;
code configured to apply the at least one hardware-level instruction to the integrated circuit comprising the BIST module;
code configured to monitor the status of at least one data storage location of the integrated circuit; and
code configured to determine whether the status of the at least one data storage location is indicative of an expected condition of the integrated circuit.

18. The computer-readable storage medium of claim 17, wherein the code configured to generate a hardware-level instruction generates at least one assembler instruction.

19. The computer-readable storage medium of claim 17, wherein the BIST emulator comprises a plurality of modules modeled after functions of a respective block of the integrated circuit.

20. A computer-readable storage medium comprising an integrated circuit test program, the integrated circuit test program comprising:
means for emulating a built-in self test (BIST) module of an integrated circuit;
means for applying a hardware-level instruction to the integrated circuit comprising the BIST module responsive to an operator level instruction applied to the means for emulating the BIST module; and
means for monitoring a status of a data storage element within the integrated circuit.

* * * * *

UNITED STATES PATENT AND TRADEMARK OFFICE
CERTIFICATE OF CORRECTION

| | | |
|---|---|---|
| PATENT NO. | : 7,818,645 B2 | Page 1 of 1 |
| APPLICATION NO. | : 11/185291 | |
| DATED | : October 19, 2010 | |
| INVENTOR(S) | : Elias Gedamu et al. | |

It is certified that error appears in the above-identified patent and that said Letters Patent is hereby corrected as shown below:

In column 7, line 5, in Claim 1, delete "sell-test" and insert -- self-test --, therefor.

In column 7, line 28, in Claim 6, after "medium" insert -- of --.

Signed and Sealed this
Eighth Day of March, 2011

David J. Kappos
*Director of the United States Patent and Trademark Office*